US008897038B2

(12) United States Patent
Li (10) Patent No.: US 8,897,038 B2
(45) Date of Patent: Nov. 25, 2014

(54) SWITCHING POWER CONVERTER DYNAMIC LOAD DETECTION

(75) Inventor: Yong Li, San Jose, CA (US)

(73) Assignee: Dialog Semiconductor Inc., Campbell, CA (US)

( * ) Notice: Subject to any disclaimer, the term of this patent is extended or adjusted under 35 U.S.C. 154(b) by 166 days.

(21) Appl. No.: 13/563,453

(22) Filed: Jul. 31, 2012

(65) Prior Publication Data

US 2014/0036549 A1    Feb. 6, 2014

(51) Int. Cl.
  *H02M 3/335*  (2006.01)

(52) U.S. Cl.
  USPC ...................................... 363/21.16

(58) Field of Classification Search
  USPC ............ 363/21.04, 21.05, 21.07, 21.08, 21.1, 363/21.11, 21.15, 21.18, 21.16
  See application file for complete search history.

(56) References Cited

U.S. PATENT DOCUMENTS

| | | | |
|---|---|---|---|
| 7,719,860 B2 * | 5/2010 | Usui | 363/21.12 |
| 7,821,797 B2 | 10/2010 | Nishiyama et al. | |
| 7,864,546 B2 | 1/2011 | Dhuyvetter et al. | |
| 8,125,799 B2 | 2/2012 | Zhu et al. | |
| 2008/0157743 A1 * | 7/2008 | Martin et al. | 323/284 |
| 2009/0015227 A1 * | 1/2009 | Wong et al. | 323/283 |
| 2009/0059632 A1 * | 3/2009 | Li et al. | 363/124 |
| 2009/0230930 A1 * | 9/2009 | Jain et al. | 323/234 |
| 2009/0279334 A1 * | 11/2009 | Xiong et al. | 363/126 |
| 2010/0164455 A1 * | 7/2010 | Li et al. | 323/283 |
| 2012/0081927 A1 | 4/2012 | Matsumoto | |

OTHER PUBLICATIONS

Korean Intellectual Property Office, Office Action, Korean Patent Application No. 10-2013-0090700, Aug. 5, 2014, seven pages.

* cited by examiner

*Primary Examiner* — Adolf Berhane
*Assistant Examiner* — Jeffrey Gblende
(74) *Attorney, Agent, or Firm* — Fenwick & West LLP (57) ABSTRACT

A secondary-side dynamic load detection system and method rapidly identifies when a dynamic load has been placed on the output (e.g., when an electronic device is re-connected to the switching power converter). Once a dynamic load condition has been detected by the secondary side detector, a dynamic load detection signal is communicated from the secondary side of the switching power converter to a switch controller on the primary side. The switch controller can then quickly adapt switching in response to the dynamic load condition.

12 Claims, 6 Drawing Sheets

SWITCHING POWER CONVERTER DYNAMIC LOAD DETECTION

FIELD OF THE INVENTION

The present invention relates to a power supply and more particularly to detecting a dynamic load change in a switching power converter.

DESCRIPTION OF THE RELATED ARTS

Conventional switching power supplies such as flyback power converters regulate power to a load by using a switch controller to control on-times and off-times of a switch based upon one or more feedback signals representing output power, output voltage, and/or output current. When the load is disconnected from the switching power converter, some conventional power supplies decrease switching to very low frequencies in order to maintain the output voltage at a regulated level with minimal power consumption. When the load is re-connected to the switching power converter, the output voltage begins to fall until the switch controller can detect the voltage drop via the feedback signals and compensate for the increased load demand. However, due to the relatively long period between switching cycles, a substantial delay may be observed before the switch controller can detect and react to the change in output voltage. As a result, the conventional switching power converter suffers from poor dynamic response to changing loading conditions.

SUMMARY OF THE INVENTION

A switching power converter and method enable rapid detection of a dynamic load change in order to quickly adapt switching in response to the load change. A switching power converter provides regulated power to a load. A transformer includes a primary winding coupled to an input voltage and a secondary winding coupled to an output voltage of the switching power converter. The transformer electrically isolates a primary side of the switching power converter corresponding to the primary winding and a secondary side of the switching power converter corresponding to the secondary winding. A switch is coupled to the primary winding of the power converter. Current is generated through the primary winding while the switch is turned on and is not generated while the switch is turned off. A dynamic load detector circuit coupled to the load on the secondary side of the switching power converter monitors an output voltage to the load and generates a detection signal indicative of a dynamic load change based on a rate of change of the output voltage exceeding a threshold rate of change. A switch controller on the primary side of the switching power converter generates a control signal to turn on or turn off the switch. The switch is turned on responsive to the control signal being in a first state and the switch is turned off responsive to the switch controller being in a second state. The switch controller is further configured to generate a switching cycle of the switch responsive to the dynamic load detection signal being generated.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

DETAILED DESCRIPTION OF EMBODIMENTS

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

A secondary-side dynamic load detection system and method rapidly identify dynamic load changes at the output of a switching power converter (e.g., when an electronic device is re-connected to the switching power converter). Once a dynamic load condition has been detected by the secondary side detector, a dynamic load detection signal is communicated from the secondary side of the switching power converter to a switch controller on the primary side. The switch controller can then quickly adapt switching in response to the dynamic load condition. In one embodiment, the dynamic load detection signal is communicated from the secondary-side of the switching power converter to the primary-side controller without the use of additional isolation components between the primary side and second side of the switching power converter (e.g. opto-isolator, feedback transformer, etc.).

Figure 1:
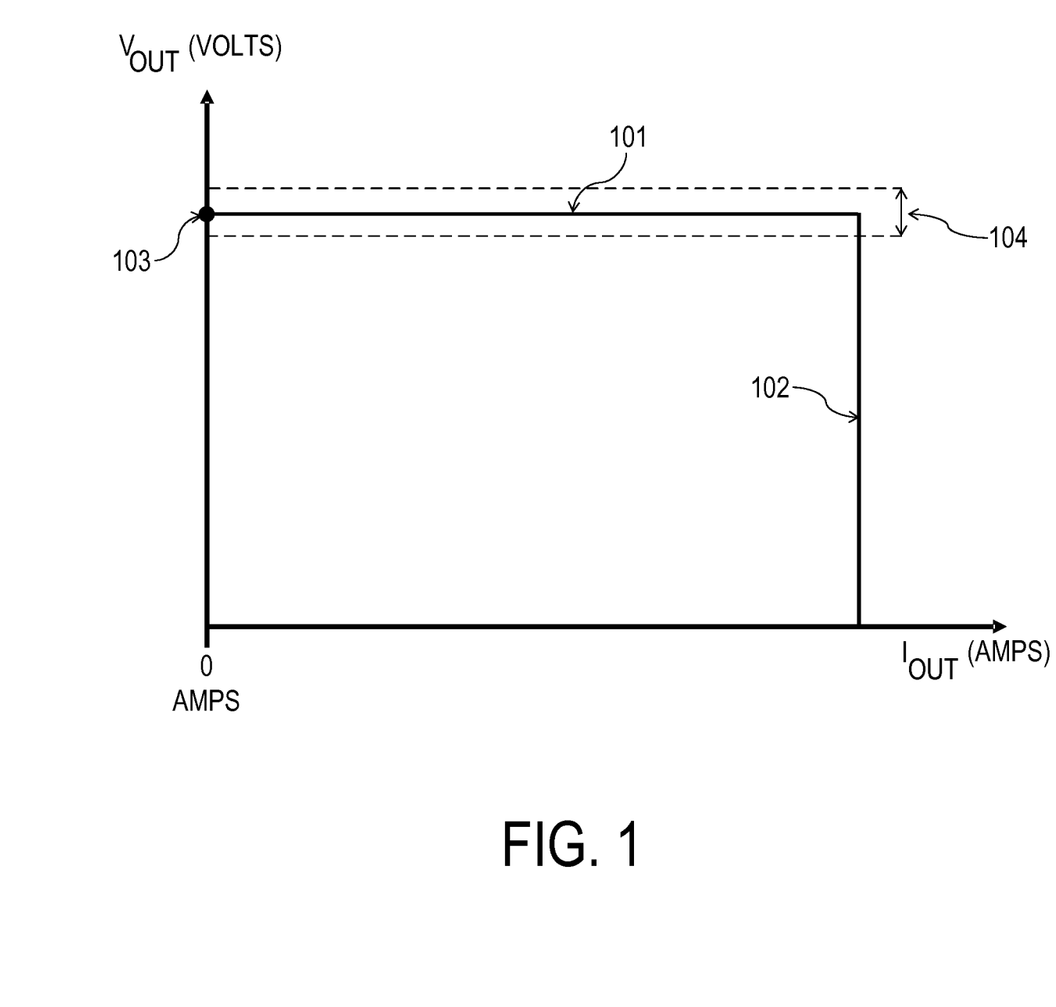
FIG. 1 illustrates an embodiment of a current-voltage curve of a switching power converter having a plurality of operating modes.

In one embodiment, a switching power converter operates in a plurality of different operating modes. For example, FIG. 1 illustrates an operating curve of a switching power converter that provides controlled and regulated power to an electronic device based on three major operating modes: (1) constant voltage mode (CVM) 101; (2) constant current mode (CCM) 102; and (3) no load conditions 103. In CVM 101, the switching power converter is configured to supply a regulated DC output of a substantially fixed voltage within a certain tolerance represented by CVM range 104. In one embodiment, the switching power converter operates in CVM 101 when the internal battery of the electronic device being powered is fully charged. The fixed voltage output of the switching power converter provides the operating power for the electronic device to be operated normally.

In CCM 102, the switching power converter is configured to provide a fixed current output. In one embodiment, the switching power converter operates in CCM 102 when the internal battery of the electronic device is not fully charged. The constant current output of the switching power converter allows for efficient charging of the internal battery of the electronic device.

Under No-Load conditions 103 the switching power converter is disconnected from the electronic device. Here, the switching power converter is configured to maintain a regulated voltage output (but does not provide any current) in anticipation of the electronic device being re-connected to the switching power converter.

Figure 2:
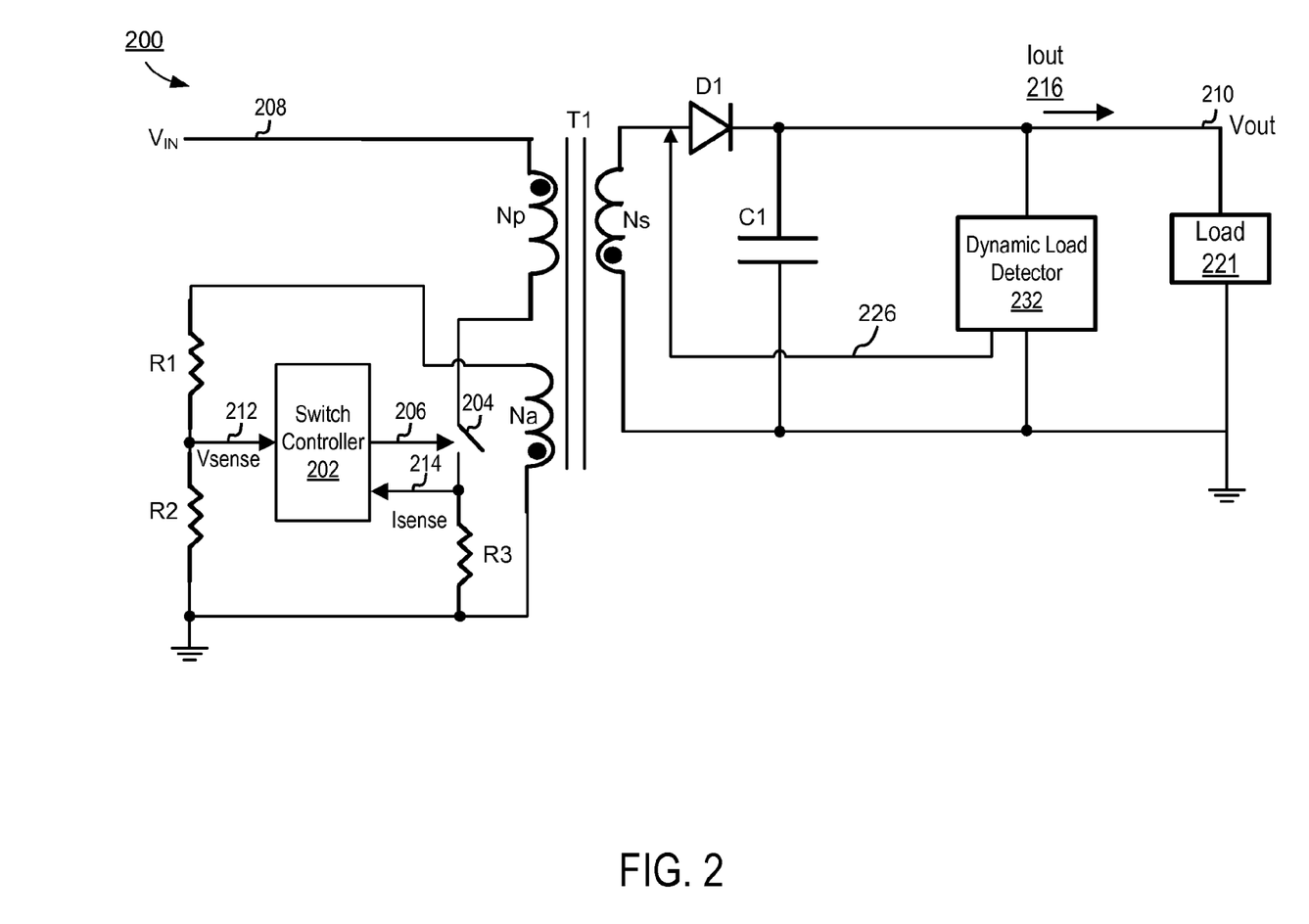
FIG. 2 is a circuit diagram illustrating a first embodiment of a switching power converter having dynamic load sensing capability.

FIG. 2 is a circuit diagram illustrating an embodiment of a switching power converter 200 (e.g., a primary-side fly-back switching power converter) providing power to a load 221 (e.g., an electronic device). The switching power converter 200 includes, among other components, a transformer T1 having a primary winding Np, a secondary winding Ns, and an auxiliary winding Na, a switch 204, a switch controller 202, an output rectifier diode D1, resistors R1, R2, R3, output filter capacitor C1, and a dynamic load detector 232.

An input voltage ($V_{IN}$) 208, typically a rectified AC voltage, is input to power converter 200. Switch controller 202 controls the ON state and the OFF state of a switch 204 using pulse signal 206 with on-times ($T_{ON}$) and off-times ($T_{OFF}$). Pulse signal 206 may control switching of switch 204 using, for example pulse width modulation (PWM) or pulse frequency modulation (PFM) as will be described in further detail below.

When switch 204 is turned on (e.g., closed) during its on-time, energy is stored in the primary side windings Np of transformer T1. The voltage across the secondary winding Ns is negative and the diode D1 is reverse biased, blocking transfer of energy to load 221. In this state, energy is supplied to load 221 via capacitor C1. When switch 204 is turned off (opened), the energy stored in the primary windings Np of transformer T1 is released to the secondary side Ns of transformer T1. Diode D1 becomes forward biased enabling transfer of energy stored in the transformer T1 to load 221 and re-charging capacitor C1.

Resistors R1 and R2 form a voltage divider coupled in series with auxiliary winding Na of transformer T1, and produce sensed voltage ($V_{SENSE}$) 212, which is representative of output voltage ($V_{OUT}$) 210. In CVM operation, controller 202 monitors $V_{SENSE}$ 212 and controls switching to maintain $V_{OUT}$ 210 substantially near a desired regulation voltage $V_{REG}$ (for example, within an allowable error range). In an alternative embodiment, auxiliary winding Na may be omitted, and $V_{SENSE}$ may instead be detected by directly monitoring the voltage across primary winding Np.

Resistor R3 is coupled in series with switch 204 to produce a voltage ($I_{SENSE}$) 214 representative of the current through primary winding Np of transformer T1. $I_{SENSE}$ 214 is also representative of the output current ($I_{OUT}$) 216 through load 221 because the current through primary winding Np will be proportional to the current through secondary winding Ns. In CCM operation, controller 202 monitors $I_{SENSE}$ 214 and controls switching to maintain the $I_{OUT}$ substantially near a desired regulation current $I_{REG}$, (for example, within an allowable error range).

In one embodiment, a dual-mode control methodology may be employed by controller 202 using a combination of pulse width modulation (PWM) control and pulse frequency modulation (PFM) control. For example, in one embodiment, PWM control is employed when a nominal load is connected to switching power converter 200 and the switching power converter operates in CVM or CCM. However, when load 221 consumes very little power or when no load 221 is present, it can be difficult to maintain a PWM duty-cycle low enough to maintain output regulation. Thus under low load or no load conditions, controller 202 may switch to a PFM control mode. Under these conditions, the frequency of pulses is decreased significantly in order to maintain output voltage regulation, resulting in long periods of time between "ON" and "OFF" cycles of switch 204.

A drawback to using PFM control under low load or no load conditions is that the switching power converter 200 may exhibit poor dynamic load response because feedback signals $V_{SENSE}$ 212 and $I_{SENSE}$ 214 are updated infrequently due to the long switching cycle. For example, if a disconnected load 221 is re-connected to switching power converter 200 during the period between PFM pulses, switch controller 202 will not be able to detect the re-connected load until the switching cycle corresponding to next PFM pulse occurs, which may be a relatively long period. As a result, $V_{OUT}$ 210 will begin to drop, and this drop will not be detected until $V_{SENSE}$ 212 and $I_{SENSE}$ 214 are updated during the next PFM pulse.

In order to avoid the drawback discussed above, a dynamic load detector 232 on the secondary side of the switching power converter 200 can detect a dynamic load change (e.g., reconnecting a load 221 under no load conditions) and indicate such dynamic load detection to switch controller 202. In response, switch controller 202 initiates a switching cycle of switch 204 (without waiting the full PFM period). By restarting the switching period, feedback signals $V_{SENSE}$ 212 and $I_{SENSE}$ 214 are updated to represent $V_{OUT}$ 210 and $I_{OUT}$ 216, respectively, with the current load condition (e.g., re-connected load). Switch controller 202 can then modify switching of switch 204 to achieve the desired regulation in response to the changing load conditions.

In one embodiment, dynamic load detector 232 monitors the rate of change dV/dt of the output voltage $V_{OUT}$ 210 and compares the rate of change dV/dt to a threshold rate of change. If the detected rate of change dV/dt crosses (e.g., exceeds) the threshold, dynamic load detector 232 generates a pulse or other predetermined signal pattern via feedback signal 226. Feedback signal 226 is coupled to secondary winding Ns and causes a voltage change across the secondary winding Ns (e.g., a voltage pulse) by injecting a current into secondary winding Ns. This voltage change is reflected to the auxiliary winding Na on the primary side of transformer T1, and can be detected by switch controller 202 via $V_{SENSE}$ 212. Alternatively, auxiliary winding Na may be omitted and switch controller 202 may detect the voltage change by directly monitoring primary winding Np. In response to the load detection signal, switch controller 202 initiates an ON/OFF cycle of switch 204 without waiting for the next switching period according to the operating mode under which the switching power converter was operating, thereby causing an update to $V_{SENSE}$ 212 and $I_{SENSE}$ 214 immediately and enabling switch controller 202 to quickly react to the dynamic load change.

In one embodiment, feedback signal 226 causes the voltage change across secondary winding Ns by controlling a transistor (not shown) coupled in series with secondary winding Ns. Turning the transistor on and off causes a sudden change in current through secondary windings Ns, producing the voltage pulse in across secondary winding Ns.

Figure 3:
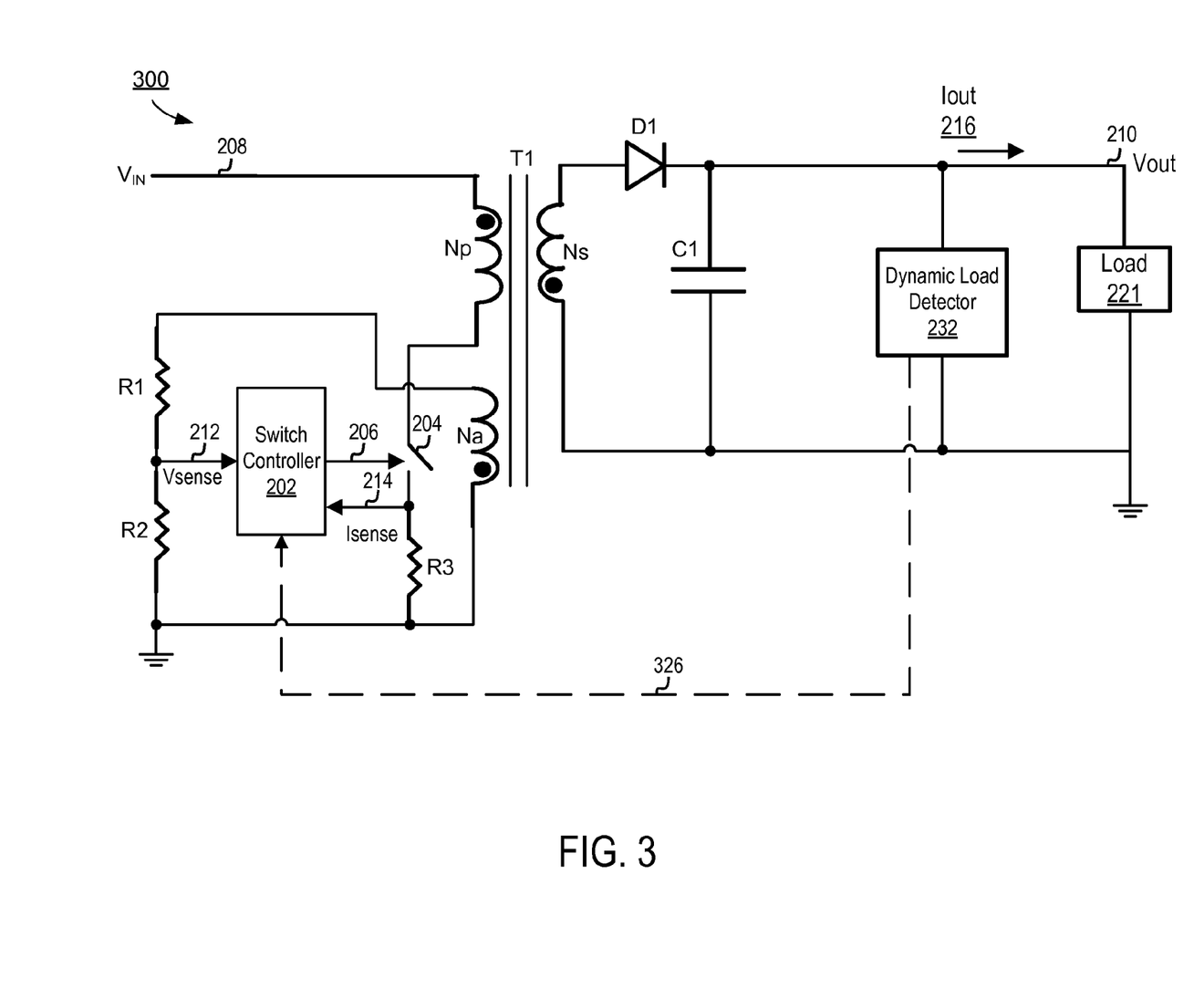
FIG. 3 is a circuit diagram illustrating a second embodiment of a switching power converter having dynamic load sensing capability.

FIG. 3 illustrates an alternative embodiment of a switching power converter 300. This embodiment is similar to switching power converter 200 of FIG. 2, except that dynamic load detector 232 outputs a feedback signal 326 directly to switch controller 202 without relying on primary side sensing. For example, in one embodiment, an optocoupler or other device is used to transmit feedback signal 326 from dynamic load detector 232 to switch controller 202 in order to maintain electrical isolation between the secondary side and primary side of switching power converter 300.

Figure 4:
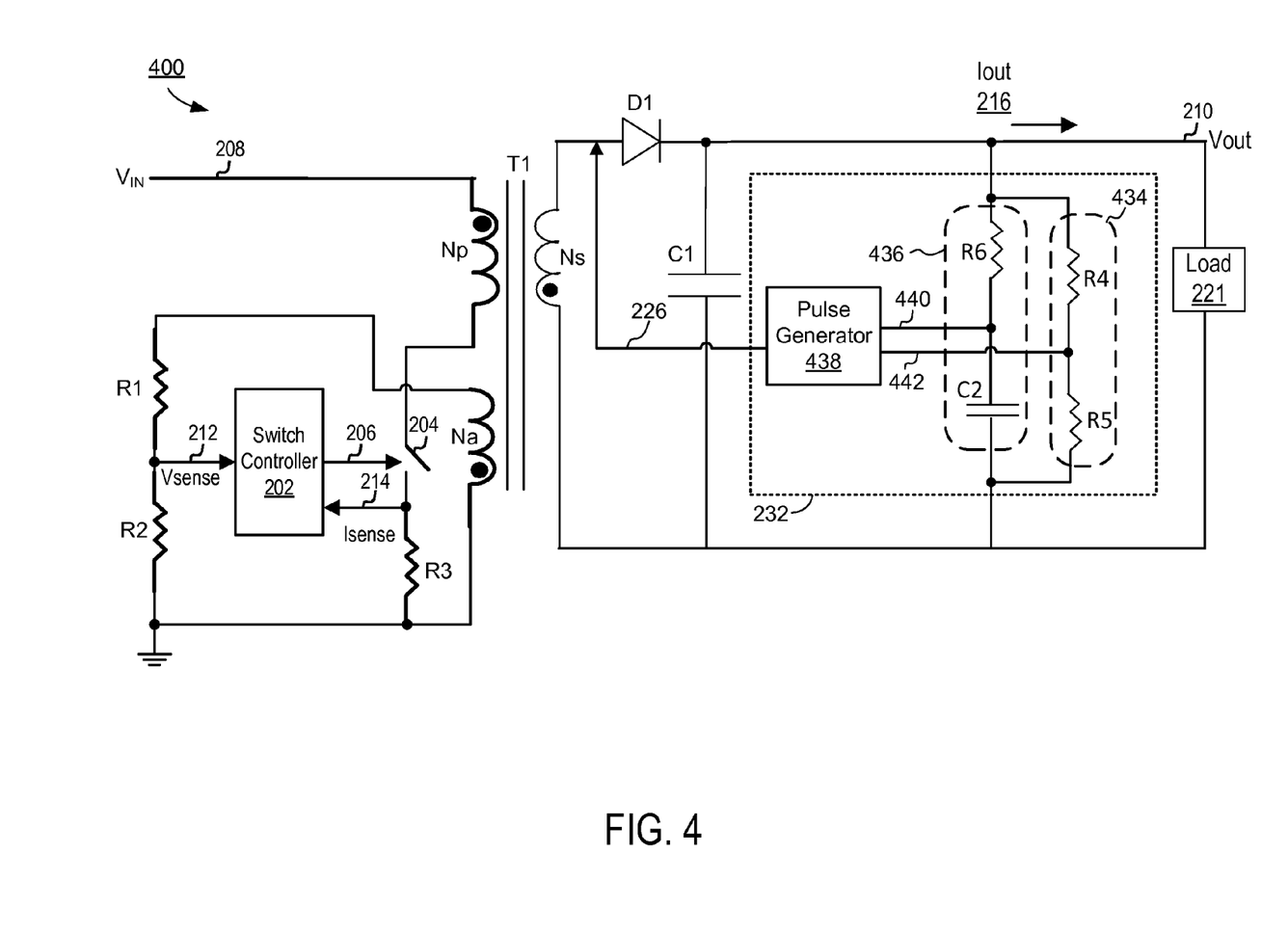
FIG. 4 is a circuit diagram illustrating a third embodiment of a switching power converter having dynamic load sensing capability.

FIG. 4 illustrates a switching power converter 400 showing one example implementation of dynamic load detector 232 in further detail. In this embodiment, dynamic load detector 232 comprises an output voltage bias circuit 434, a dV/dt detection circuit 436, and a pulse generator 438. Output voltage bias circuit 434 comprises resistors R4, R5 arranged in a voltage divider configuration and generates an output bias signal 442 representative of $V_{OUT}$ 210. dV/dt circuit 436 comprises resistor R6 and capacitor C2 arranged as an RC divider. dV/dt circuit 436 generates dV/dt signal 440 which varies based on both the magnitude and the rate of change of $V_{OUT}$ 210.

Output bias signal 442 and dV/dt signal 440 will vary at different rates in response to changes in $V_{OUT}$ 210 based on the RC time constant of dV/dt circuit 436. When $V_{OUT}$ 210 changes slowly over time and/or remains in a very narrow DC voltage range, the deviation between output bias signal 442 and dV/dt signal 440 will remain relatively small (not accounting for scaling). For example, in constant-current mode operation and start-up mode, the rate of change of $V_{OUT}$ 210 is relatively low, and thus the deviation between output bias signal 442 and dV/dt signal 440 will remain relatively small (e.g., below a threshold differential). However, when there is a sudden variation of $V_{OUT}$ 210, output bias signal 442 and dV/dt signal 440 will have a greater differential from each other (e.g., above the threshold differential) indicating a relatively high rate of change of $V_{OUT}$ 210. Such sudden variation of $V_{OUT}$ 210 may occur in response to a dynamic load change, such as when the load 221 is re-connected to the output voltage following no-load conditions.

Pulse generator 438 receives output bias signal 442 and dV/dt signal 440 and compares the signals to determine a voltage differential between the output bias signal 442 and dV/dt signal 440. Pulse generator 438 then compares this differential to a threshold differential. In response to detecting a voltage differential between output bias signal 442 and dV/dt signal 440 that is above the threshold differential, pulse generator 438 generates one or more pulses on feedback signal 226. These pulses are injected into secondary winding Ns and can be sensed on the primary side via auxillary winding Na and/or primary winding Np as described above. Once a pulse is detected, switch controller 202 initiates an "ON" and "OFF" cycle, thus obtaining a feedback signal in order to obtain the state of output voltage 210.

Figure 5:
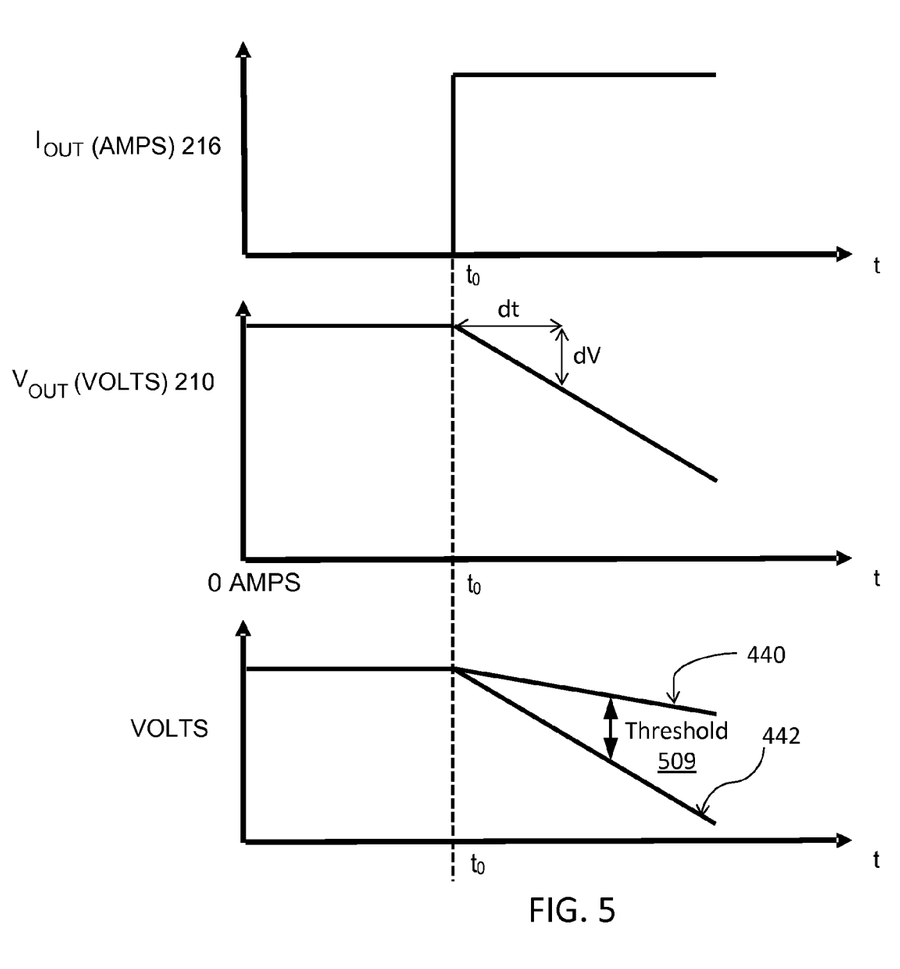
FIG. 5 illustrates current-voltage curves for a switching power converter having dynamic load sensing capability.

FIG. 5 illustrates example waveforms for a dynamic load condition. At time $t_0$, $I_{OUT}$ 216 experiences a sudden increase. This may be due to, for example, a previously unconnected load (e.g., an electronic device) being connected to the switching power converter. The sudden increase in $I_{OUT}$ 216 causes $V_{OUT}$ 210 to drop at a rate of dV/dt. The output bias signal 442 varies proportionally to $V_{OUT}$ 210 and therefore drops at approximately the same rate of change dV/dt as Vout 210. The rate of decrease of dV/dt signal 440 is defined by the RC time constant of dV/dt circuit 436 and drops at a lower rate of change than output bias signal 442. In order to better illustrate this point, output bias signal 442 and dV/dt signal 440 are shown to have the same steady-state scale, but this is not necessarily required as difference in scale could be compensated for in pulse generator 438. When the difference between output bias signal 442 and dV/dt signal 440 exceeds a threshold 509, the dynamic load condition is detected.

Threshold 509 is set low enough to detect the dynamic load condition but is set high enough to distinguish the dynamic load condition from other conditions such as start-up and constant-current mode operation, where $V_{OUT}$ 210 varies at a lesser rate. For example, in typical CCM operation, $V_{OUT}$ 210 remains within the regulation range and $I_{OUT}$ 216 exhibits only gradual changes. Thus, the differential between output bias signal 442 and dV/dt signal 440 will remain below a detection threshold and no voltage pulse is generated by pulse generator 438.

In CCM operation, typically found when charging the battery of the electronic device, $I_{OUT}$ 216 typically changes only gradually. Similarly, although $V_{OUT}$ 210 may fluctuate over a wide range, the rate of change is also relatively gradual. Thus, the differential voltage of output bias signal 442 and dV/dt signal 440 under these conditions also remains below a threshold differential and pulse generator 438 does not generate a detection pulse.

Furthermore, in start-up conditions of the switching power converter, switch controller 202 may control switching of switch 204 such that $V_{OUT}$ 210 and $I_{OUT}$ 216 increase only gradually. By controlling switching in this way under startup conditions, the differential voltage between output bias signal 442 and dV/dt signal 440 will remain below the threshold differential 509 during startup, and the startup condition can be distinguished from the dynamic load condition.

However, in the case of a sudden increase of $I_{OUT}$ 216 (e.g., resulting in a sudden drop in $V_{OUT}$), output bias signal 442 will lag behind dV/dt signal 440. The amount of lag is based on RC time constant of R6 and C2 and the rate of drop of $V_{OUT}$ 210. Once the magnitude of the differential voltage between output bias signal 442 and dV/dt signal 440 exceed the threshold 509, pulse generator 438 causes a current increase through secondary winding Ns, which in turn generates a voltage pulse across secondary winding Ns. The voltage pulse is transferred to the primary side (e.g., via auxiliary winding Na or directly from primary winding Np) and detected by switch controller 202. Once a pulse is detected, switch controller 202 initiates an "ON" and "OFF" cycle, thus generating an update to feedback signals $V_{SENSE}$, $I_{SENSE}$ in order to obtain the state of output $V_{OUT}$.

Figure 6:
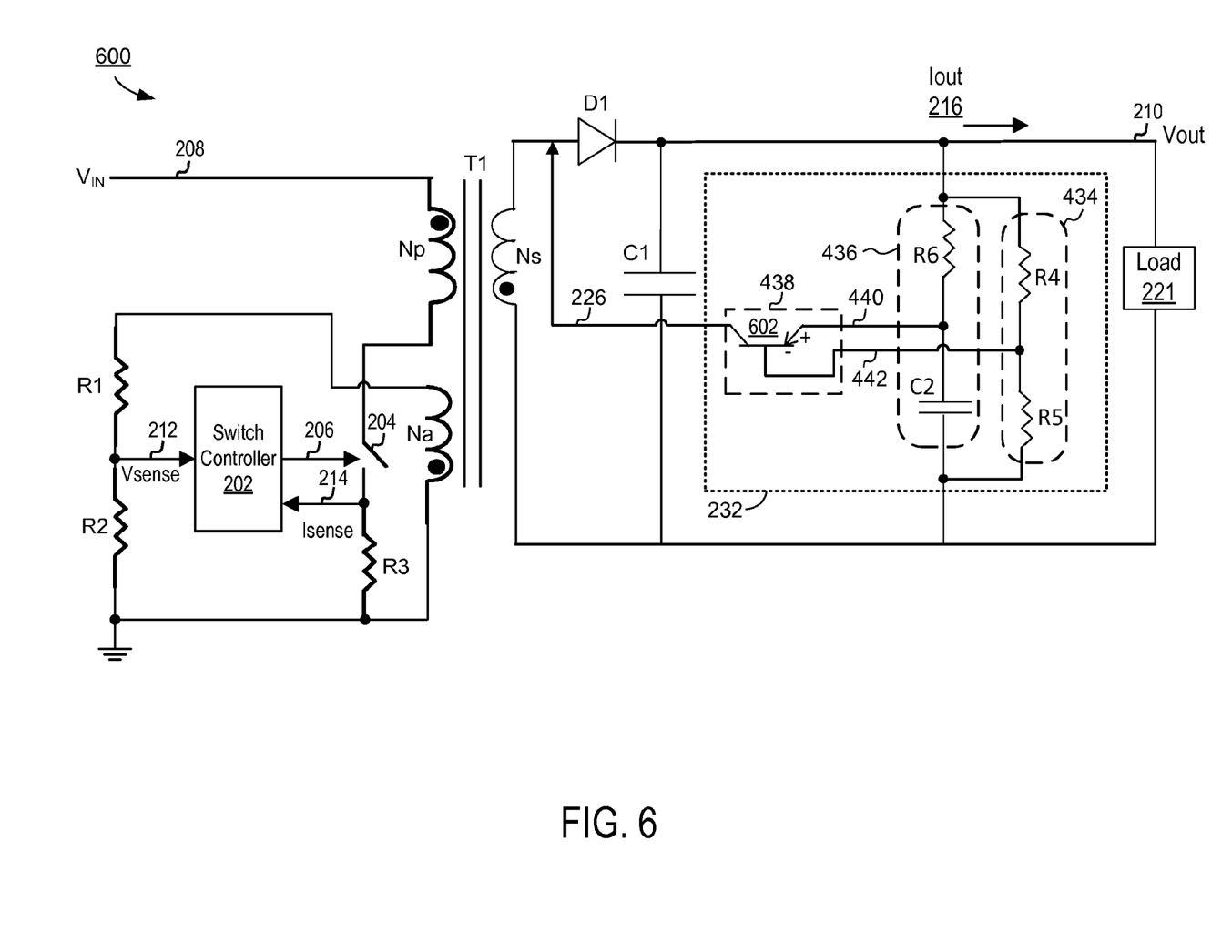
FIG. 6 is a circuit diagram illustrating a fourth embodiment of a switching power converter having dynamic load sensing capability.

FIG. 6 is a circuit diagram of switching power converter 600 showing an example implementation of pulse generator 438 in further detail. In this embodiment, pulse generator 438 is implemented as a PNP transistor 602. Output bias signal 442 is coupled to the base of PNP transistor 602 and dV/dt signal 440 is coupled to the emitter of PNP transistor 602. The collector of PNP transistor 602 is connected to the secondary winding Ns of transformer T1.

When $I_{OUT}$ 216 exhibits only gradual changes, the differential voltage of output bias signal 442 and dV/dt signal 440 remain within the emitter-to-base turn-on threshold voltage of PNP transistor 602. Thus, the PNP transistor remains in the "OFF" state and has no impact on the operation of switching power converter 600. However, in the case of a sudden increase of $I_{OUT}$ 216 (e.g., resulting in a sudden drop in $V_{OUT}$ 210), output bias signal 442 will lag behind dV/dt signal 440. Once the magnitude of the differential voltage between output bias signal 442 and dV/dt signal 440 exceed the emitter-to-base turn-on threshold voltage of PNP transistor 602, PNP transistor 602 is placed in the "ON" state causing an increase in current flow through secondary winding Ns. This generates a voltage pulse across the secondary winding Ns of power transformer T1 which is detected on the primary side by switch controller 202.

Upon reading this disclosure, those of skill in the art will appreciate still additional alternative designs for dynamic load detection in a switching power converter. Thus, while particular embodiments and applications of the present invention have been strafed and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention.

The invention claimed is:

1. A switching power converter for providing regulated power to a load, the switching power converter comprising:
a transformer including a primary winding coupled to an input voltage and a secondary winding coupled to an output of the switching power converter, the transformer electrically isolating a primary side of the switching power converter corresponding to the primary winding and a secondary side of the switching power converter corresponding to the secondary winding;
a switch coupled to the primary winding of the transformer, current through the primary winding being generated while the switch is turned on and not being generated while the switch is turned off;
a dynamic load detector circuit coupled to the load on the secondary side of the switching power converter, the dynamic load detector circuit configured to monitor an output voltage to the load and generate a dynamic load detection signal indicative of a dynamic load change responsive to a rate of change of the output voltage exceeding a threshold rate of change, the dynamic load detection signal comprising a voltage pulse across the secondary winding of the transformer; and
a switch controller on the primary side of the switching power converter, configured to generate a control signal to turn on or turn off the switch, the switch being turned on responsive to the control signal being in a first state and the switch being turned off responsive to the control signal being in a second state, the switch controller further configured to detect the dynamic load detection signal via primary-side sensing, and the switch controller further configured to generate a switching cycle of the switch responsive to the dynamic load detection signal being detected.

2. The switching power converter of claim 1, further comprising:
a voltage sensing circuit on the primary side of the switching power converter, the voltage sensing circuit sensing a voltage representative of a voltage across the secondary winding of the transformer, wherein the dynamic load detection signal is detected via the voltage sensing circuit.

3. The switching power converter of claim 2, wherein the voltage sensing circuit comprises:
an auxiliary winding of the transformer on the primary side of the switching power converter to generate a voltage proportional to the voltage across the secondary winding.

4. The switching power converter of claim 1, wherein the dynamic load detector circuit comprises:
an output bias voltage circuit to generate an output bias signal representative of the output voltage;
a dV/dt circuit to generate a dV/dt signal as a function of a rate of change of the output voltage; and
a pulse generator circuit to receive the output bias signal and the dV/dt signal, and to generate the detection signal responsive to a voltage difference between the output bias signal and the dV/dt signal exceeding a voltage differential threshold.

5. The switching power converter of claim 4, wherein the dV/dt circuit comprises an RC circuit.

6. The switching power converter of claim 4, wherein the pulse generator circuit comprises:
a PNP transistor having an emitter, a base, and a collector, wherein the output bias signal is coupled to the emitter, the dV/dt circuit is coupled to the base, and the collector is coupled to the secondary winding of the transformer.

7. A method of controlling a switching power converter, the switching power converter including a transformer with a primary winding coupled to an input voltage and a secondary winding coupled to an output of the switching power converter, and a switch coupled to the primary winding of the transformer, the transformer electrically isolating a primary side of the switching power converter corresponding to the primary winding and a secondary side of the switching power converter corresponding to the secondary winding, and current through the primary winding being generated while the switch is turned on and not being generated while the switch is turned off, the switch controlled by a switch controller, the method comprising:
monitoring an output voltage to a load using a dynamic load detector circuit on the secondary side of the switching power converter;
generating, by the dynamic load detector circuit, a dynamic load detection signal indicative of a dynamic load change responsive to a rate of change of the output voltage exceeding a threshold rate of change, the dynamic load detection signal comprising a voltage pulse across the secondary winding of the transformer;
detecting the voltage pulse across the secondary winding of the transformer via primary-side sensing; and
initiating a switching cycle of the switch responsive to the switch controller receiving the indication of the dynamic load change.

8. The method of claim 7, wherein detecting the voltage pulse via primary-side sensing comprises:
sensing a voltage across an auxiliary winding of the transformer on the primary side of the switching power converter, the sensed voltage representative of the voltage pulse.

9. The method of claim 7, wherein generating the dynamic load detection signal comprises:
generating an output bias signal representative of the output voltage;
generating a dV/dt signal as a function of the rate of change of the output voltage; and
generating the detection signal responsive to a voltage difference between the output bias signal and the dV/dt signal exceeding a voltage differential threshold.

10. A method of controlling a switching power converter, the switching power converter including a transformer with a primary winding coupled to an input voltage and a secondary winding coupled to an output of the switching power converter, and a switch coupled to the primary winding of the transformer, the transformer electrically isolating a primary side of the switching power converter corresponding to the primary winding and a secondary side of the switching power converter corresponding to the secondary winding, and current through the primary winding being generated while the switch is turned on and not being generated while the switch is turned off, the method comprising:

receiving, by a switch controller, a voltage sense signal representing, a voltage across the primary winding or across a primary-side auxiliary winding of the transformer;

controlling, by the switch controller, switching of the switch according to a pulse-frequency modulation or pulse width modulation control based on the voltage sense signal to regulate the power to a load within a predefined voltage regulation range;

detecting, by the switch controller, a predetermined signal pattern comprising one or more voltage pulses in the voltage sense signal, the predetermined signal pattern occurring in response to a rate of change of an output voltage exceeding a threshold rate of change; and responsive to the switch controller detecting the predetermined signal pattern in the voltage sense signal, initiating, by the switch controller, a switching cycle of the switch without delaying until a start of a next switching period.

11. The method of claim 10, further comprising:
detecting that the load is disconnected from the switching power converter based on the voltage sense signal; and
responsive to detecting that the load is disconnected, controlling the switch using pulse frequency modulation.

12. The method of claim 10, further comprising:
detecting that the load is re-connected from the switching power converter based on the voltage sense signal; and
responsive to detecting that the load is re-connected, controlling the switch using pulse width modulation.

* * * * *